United States Patent
Ikeda et al.

(10) Patent No.: US 7,736,440 B2
(45) Date of Patent: Jun. 15, 2010

(54) METHOD AND APPARATUS FOR PREVENTING ADHERENCE OF SOLID PRODUCTS IN GAS EXHAUST PIPE AND EXHAUST GAS ABATEMENT DEVICE WITH SAME APPARATUS

(75) Inventors: Hiroshi Ikeda, Kanagawa (JP); Takashi Kyotani, Kanagawa (JP); Takanori Samejima, Hyogo (JP); Kenji Kamimura, Kanagawa (JP); Munetaka Kitajima, Tokyo (JP)

(73) Assignee: Ebara Corporation, Tokyo (JP)

( * ) Notice: Subject to any disclaimer, the term of this patent is extended or adjusted under 35 U.S.C. 154(b) by 395 days.

(21) Appl. No.: 10/343,322

(22) PCT Filed: Aug. 8, 2001

(86) PCT No.: PCT/JP01/06801

§ 371 (c)(1),
(2), (4) Date: Feb. 5, 2003

(87) PCT Pub. No.: WO02/11912

PCT Pub. Date: Feb. 14, 2002

(65) Prior Publication Data

US 2003/0175176 A1  Sep. 18, 2003

(30) Foreign Application Priority Data

Aug. 8, 2000 (JP) ............................. 2000-239990
Mar. 5, 2001 (JP) ............................. 2001-060220

(51) Int. Cl.
*B08B 3/00* (2006.01)
(52) U.S. Cl. .................... 134/22.12; 134/22.11

(58) Field of Classification Search .................. 134/8, 134/9, 22.1, 22.11, 22.12, 24, 26, 36, 166 C, 134/167 C, 168 C, 169 C, 267 C; 422/168, 422/178
See application file for complete search history.

(56) References Cited

U.S. PATENT DOCUMENTS 3,577,709 A   5/1971   Hoad
(Continued)

FOREIGN PATENT DOCUMENTS

JP   106395/1987   1/1989
(Continued)

OTHER PUBLICATIONS

Supplementary European Search Report dated Mar. 8, 2006.

*Primary Examiner*—Alexander Markoff
(74) *Attorney, Agent, or Firm*—Westerman, Hattori, Daniels & Adrian, LLP

(57) ABSTRACT

A solid product removal method for removing a solid product adhering to a gas exhaust pipe member having a rinsing water inlet pipe member with a tip opening located inside the gas exhaust pipe member for feeding rinsing water into the inside of the gas exhaust pipe member from the tip opening thereof; hence a solid product formed newly upon reaction with the rinsing water and adhering thereto can be rinsed off with the rinsing water introduced from another tip opening located at a different position; and therefore, an adherence of the solid product can be prevented from heating the inner face of the gas exhaust pipe member. A scraping member for scraping the solid product stuck to the inner face of the gas exhaust pipe member may be used.

2 Claims, 12 Drawing Sheets

U.S. PATENT DOCUMENTS

| | | |
|---|---|---|
| 3,582,142 A | 6/1971 | Titus |
| 5,353,879 A | 10/1994 | Watanabe et al. |
| 5,833,888 A | 11/1998 | Arya et al. ............... 261/112.1 |
| 5,846,275 A | 12/1998 | Lane et al. .................... 55/431 |
| 5,882,366 A | 3/1999 | Holst et al. .................. 55/431 |
| 5,935,283 A | 8/1999 | Sweeney et al. ............... 55/431 |

FOREIGN PATENT DOCUMENTS

| | | |
|---|---|---|
| JP | 02-22536 A | 1/1990 |
| JP | 4-94720 | 3/1992 |
| JP | 4-114717 | 4/1992 |
| JP | 7-299429 | 11/1995 |
| JP | 07-299429 A | 11/1995 |
| JP | 8-127874 | 5/1996 |
| JP | 08-127874 A | 5/1996 |
| JP | 8-281222 | 10/1996 |
| JP | 08-281233 A | 10/1996 |
| JP | 2000-87852 | 3/2000 |
| JP | 2000-271421 | 10/2000 |
| JP | 2000-306842 | 11/2000 |
| JP | 2000-334409 | 12/2000 |

METHOD AND APPARATUS FOR PREVENTING ADHERENCE OF SOLID PRODUCTS IN GAS EXHAUST PIPE AND EXHAUST GAS ABATEMENT DEVICE WITH SAME APPARATUS

TECHNICAL FIELD

The present invention relates to a method and an apparatus for preventing adherence of a solid product in a gas exhaust pipe member and, more particularly, to a method and an apparatus suitable for preventing adherence of a solid product in a gas exhaust pipe member for leading an exhaust gas discharged from a semiconductor manufacturing apparatus to an exhaust gas abatement device.

BACKGROUND TECHNOLOGY

FIG. 17 illustrates a layout of a general-type exhaust gas removal apparatus for a semiconductor manufacturing apparatus. In a semiconductor manufacturing apparatus 100, semiconductor substrates are processed using a variety of processing gases in a vacuum chamber 102, and the processing gas is discharged from the vacuum chamber 102 with a vacuum pump 104 and fed to an exhaust gas abatement device 106 connected to a downstream side (an outlet side) of the vacuum pump. The hazardous gas is then processed to become a non-hazardous gas that in turn is fed to an gas exhaust duct 108. As the exhaust gas contains an ingredient having a low vapor pressure at ambient temperature, it may become solidified at the time when the pressure downstream of the vacuum pump 104 elevates, and may then adhere to an exhaust pipe member and become deposited thereonto. For instance, such an ingredient may include but is not limited to aluminum chloride ($AlCl_3$) discharged in an etching process for aluminum wiring, ammonium chloride ($NH_4Cl$) derived in a process for forming a film of silicone nitride (SiN) or titan nitride (TiN), and tetraethyl silicate (TEOS) used in forming a film of silicone oxide ($SiO_2$).

Further, the exhaust gas may contain an ingredient that may produce a solid product upon reaction with water. For instance, such an ingredient may include but be not limited to $BCl_3$ to be used in etching for aluminum wiring, and $SiCl_4$ to be discharged upon etching a polysilicon with a Cl-type gas. These solid products may be stuck to an exhaust pipe member close to an inlet of the exhaust gas abatement device and deposited thereon because humidity in the gas exhaust pipe member becomes high in the case where the exhaust gas abatement device is of a wet type using water for the removal of a hazardous ingredient.

The adherence and deposit of the solid products in the pipe member may be generally prevented, for example, by winding an exterior portion of the gas exhaust pipe member for flowing exhaust gas with a heater and heating the gas exhaust pipe member or other processes.

The gas exhaust pipe member, however, is provided, for example, with a variety of valves or branch pipe members and a bypass pipe member connecting an upstream side (an inlet side) to a downstream side (an outlet side) of the exhaust gas abatement device, and so on, and the pipe construction may be rendered complex at many points, and thus it becomes difficult to wind the heater around the pipe member as a whole in an appropriate fashion. Therefore, problems may result, for instance, that a solid product may adhere to and deposit inn a valve unlikely to be heated or that a solid product may adhere to a portion of the pipe member where flow of an exhaust gas may slow due to a complicated pipe construction. Moreover, in the case where the exhaust gas abatement device for processing exhaust gas into a non-hazardous gas is of a wet type where the exhaust gas is brought into contact with water, a humidity may become too high at a portion of the pipe member close to the inlet of the exhaust gas abatement device, whereby it may become impossible to heat the portion thereof to a sufficiently high degree. In particular, in the case where the exhaust gas contains an ingredient producing a solid product upon reaction with water, it may present the problem that the solid product formed due to such a high level of humidity is likely to adhere to and deposit on the portion of the pipe member.

In view of the foregoing problems, the present invention has been made with the object of providing a method and an apparatus for preventing adherence and deposit of a solid product in a gas exhaust pipe member for discharging exhaust gas.

DISCLOSURE OF THE INVENTION

The present invention provides a solid product removal apparatus for removing a solid product adhering to an inner face of a gas exhaust pipe member, which is characterized by a rinsing water inlet pipe member with a tip opening disposed at the tip of the gas exhaust pipe member positioned therein so as to feed rinsing water from the tip opening to the inner face of the gas exhaust pipe member. The term "rinsing water inlet pipe member" referred to herein includes not only a single pipe member simply for introducing rinsing water, but also a means for allowing rinsing water to flow from the outside into the inside of the gas exhaust pipe member, including a hole disposed through a pipe wall of the gas exhaust pipe member, which can receive the rinsing water fed from a pipe member for introducing the rinsing water into the inside of the gas exhaust pipe member and allow the rinsing water to pass thereto.

The solid product removal apparatus is useful particularly with an exhaust gas containing an ingredient forming a solid product upon reaction with water present in the gas exhaust pipe member, since it is able to wash off the solid product formed and stuck to the inner face of the pipe member with a rinsing water.

The rinsing water inlet pipe member may be disposed on a periphery of the gas exhaust pipe member and provided with a ring-shaped rinsing water jacket member receiving rinsing water. The tip opening at the tip of the rinsing water inlet pipe member may be formed as a plurality of holes communicating with the rinsing water jacket member and further with the pipe wall of the gas exhaust pipe member and extending into the inside of the gas exhaust pipe member (disposed in a relationship spaced apart at given intervals in a peripheral direction of the gas exhaust pipe member).

More preferably, a heating means for heating the gas exhaust pipe member may be provided to evaporate rinsing water remaining in the inside of the gas exhaust pipe member by heating after introduction of the rinsing water. This is to prevent any fresh solid product from being formed with the rinsing water remaining in the inside of the gas exhaust pipe member.

The rinsing water inlet pipe member may be disposed in plural numbers, and the tip openings of the rinsing water inlet pipe members may be formed at a spaced relationship at predetermined intervals along a flow path of exhaust gas in the gas exhaust pipe member. This structure allows a fresh solid product formed and stuck upon reaction with rinsing water in the gas exhaust pipe member to be washed off with rinsing water introduced from a tip opening or openings at a different position or positions, when a solid product formed and adhering upon reaction with water in the gas exhaust pipe member is washed with rinsing water introduced from the tip opening at a given position. It is to be noted, however, that a single tip opening can perform a similar rinsing action. This can be done by changing a range of distribution of rinsing water by adjusting a pressure of discharging rinsing water from the tip opening. From this point of view, the present invention can also provide a method for rinsing a solid product in the manner as described above. More specifically, this method is characterized by a step of rinsing off a primary solid product formed upon reaction with moisture contained in an exhaust gas present on the inside of the gas exhaust pipe member by feeding a primary rinsing water, and a step of rinsing off a secondary solid product formed freshly upon reaction with the primary rinsing water adhering to the inside of the gas exhaust pipe member by feeding a secondary rinsing water.

Further, the present invention provides a solid product removal apparatus for removing a solid product stuck on an inner face of a gas exhaust pipe member, characterized by a high-temperature gas inlet means for heating the inside of the gas exhaust pipe member by introducing a high-temperature gas having a high temperature in the gas exhaust pipe member. Heating the inside of the gas exhaust pipe member may prevent a deposit of a solid product. The high-temperature gas inlet means may be disposed in such a manner that an opening thereof for discharging the high-temperature gas is formed so as to discharge the high-temperature gas toward a given location inside the gas exhaust pipe member, for example, a location at which a valve unlikely to be heated easily is mounted.

Moreover, the present invention provides a solid product removal apparatus for removing a solid product stuck to the inner face of the gas exhaust pipe member, which is characterized in that a scraping member means is disposed inside the gas exhaust pipe member so as to be slidably movable in the gas exhaust pipe member along the lengthwise direction thereof and which can scrape the solid product stuck to the inside of the gas exhaust pipe member.

In addition, the present invention provides an exhaust gas processing system for use in the preparation of semiconductors, which is characterized by a semiconductor manufacturing apparatus having a vacuum chamber for processing the semiconductors therein, a vacuum pump for discharging gas for use in the vacuum chamber from the vacuum chamber, a wet-type exhaust gas abatement device for processing the exhaust gas discharged from the vacuum pump to turn it into a non-hazardous gas, a first pipe member connecting the semiconductor manufacturing apparatus to the vacuum pump, a second pipe member connecting the vacuum pump to the exhaust gas abatement device and extending a connecting portion to be connected to the semiconductor manufacturing apparatus in a vertical direction, and a solid product removal apparatus disposed at the connecting portion of the second pipe member extending in the vertical direction for removing the solid product formed upon reaction of the exhaust gas with moisture from the wet-type exhaust gas abatement device and stuck on the inner face of the connecting portion, wherein the solid product removal apparatus has substantially the same construction as the solid product removal apparatus for removal of the solid product in the gas exhaust pipe member as described above.

BRIEF DESCRIPTION OF THE ACCOMPANYING DRAWINGS

PREFERRED EMBODIMENTS OF THE INVENTION

The present invention will be described in more detail by way of embodiments with reference to the accompanying drawings.

Figure 1:
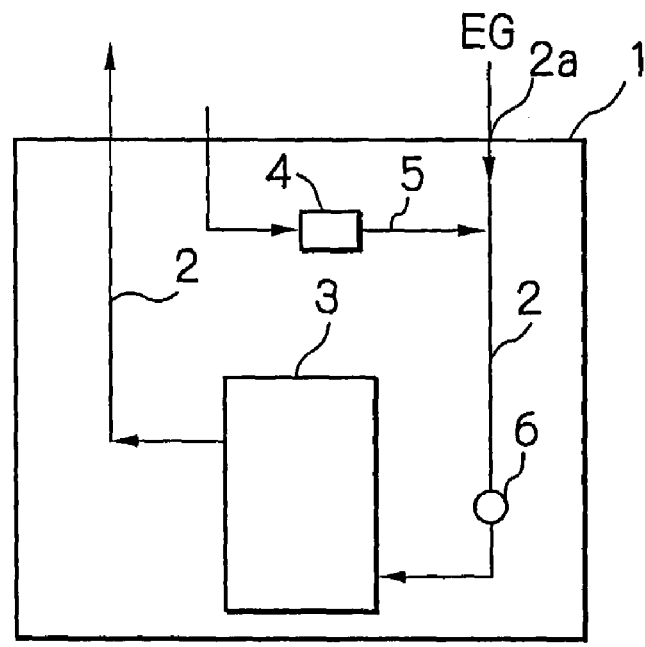
FIG. 1 is a view showing an example of a construction of an exhaust gas abatement device for carrying out a method for preventing an adherence of a solid product in the gas exhaust pipe member in accordance with the present invention.

FIG. 1 is a view showing an example of the construction of an exhaust gas abatement device for carrying out a method for preventing an adherence of a solid product in a gas exhaust pipe member in accordance with the present invention. In FIG. 1, reference numeral 1 stands for an exhaust gas abatement device for removing a hazardous ingredient from an exhaust gas containing an ingredient forming a solid product and the hazardous ingredient. The exhaust gas abatement device 1 is provided with a main pipe member 2 through which exhaust gas EG flows, and the exhaust gas EG flown into an inlet 1a of the main pipe member 2 passes through the main pipe member 2 and is introduced into a reaction section 3 where hazardous ingredients containing a solid product are to be removed.

The reaction section 3 may be of any type, whether it is of a dry type with a reagent for adsorption of a hazardous ingredient filled therein or it is of a wet type capable of removing a hazardous ingredient by exposure of exhaust gas to water or it is of a burning type or it is of a catalyst-reactive type, or it may be of a type combining one with the other. The main pipe member 2 may be formed so as to allow a high-temperature inert gas having a high temperature to flow therethrough via an inert gas inlet pipe member 5 from a high-temperature inert gas source 4 to prevent adhesion of the solid product to the inner wall of the main pipe member 2 by heating the inner wall of the main pipe member 2 with the high-temperature inert gas. In the example of the construction as shown in this drawing, the main pipe member 2 is provided with a temperature sensor 6 composed of a thermocouple or the like, and a temperature measurement value with the temperature sensor is subjected to feed-back to the high-temperature inert gas source 4 to control the inner temperature inside the main pipe member 2 to a given temperature at which no solid product sticks. However, the high-temperature inert gas source 4 can also be set in advance to a given fixed temperature in accordance with conditions for usage of the exhaust gas abatement device 1, without using such a feed-back control.

Figure 2:
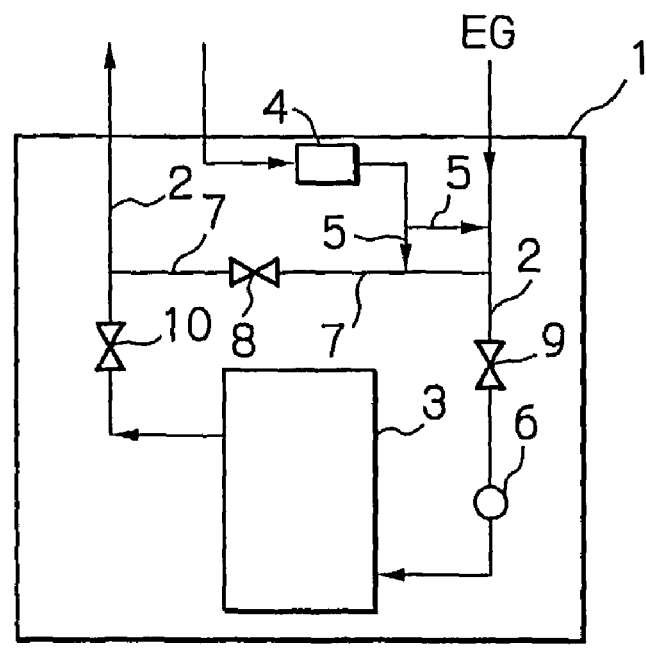
FIG. 2 is a view showing another example of a construction of an exhaust gas abatement device for carrying out a method for preventing an adherence of a solid product in the gas exhaust pipe member in accordance with the present invention.

FIG. 2 is a view showing another example of the exhaust gas abatement device in accordance with the present invention. As shown in FIG. 2, the portions provided with the same reference numerals as in FIG. 1 indicate the portions identical thereto or corresponding thereto. The same are also be applied to the other drawings. Reference numeral 7 stands for a bypass pipe member having a bypass valve 8, and the bypass pipe member 7 is connected to the main pipe member 3 at an inlet (upstream) side of the reaction section 3 and to the main pipe member 2 at an outlet (downstream) side of the reaction section 3. The bypass pipe member 7 has a role for flowing the exhaust gas EG through the bypass pipe member 7 by opening the bypass pipe member 8 as problems such as a rise of pressure due to clogging in the main pipe member 2 or at the reaction section 3 with ingredients contained in the exhaust gas EG. In the example of the construction as shown in FIG. 2, the main pipe member 2 at the inlet side and the outlet side of the reaction section 3 is provided with valves 9 and 10, respectively. Therefore, the reaction section 3 can be subjected to maintenance upon an occurrence of troubles in the manner as described above by closing and stopping these valves.

In the example of the construction of FIG. 2, an inert gas having a high temperature can be flown to the bypass pipe member 7 and the main pipe member 2 through branched inert gas inlet pipe members 5 and 5', respectively. As the bypass pipe member 8 is closed, the inert gas introduced into the bypass pipe member 7 is allowed to flow into the main pipe member 2 at the upstream side to block entry of exhaust gas into the bypass pipe member and prevent a solid product from adhering to the bypass pipe member.

Figure 3:
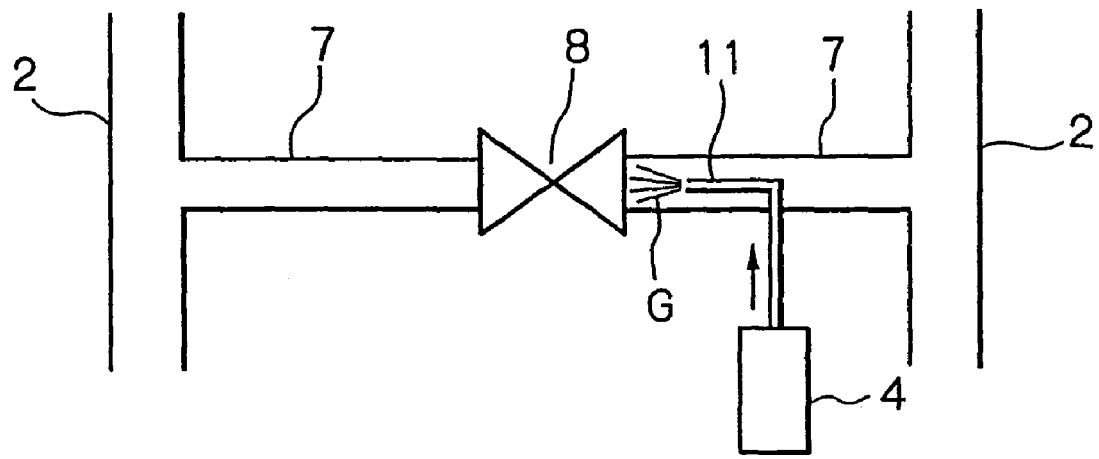
FIG. 3 is a view showing an example of a construction of an apparatus for preventing the adherence of a solid product in the gas exhaust pipe member in accordance with the present invention.

FIG. 3 shows another example of introduction of a high-temperature inert gas into the bypass pipe member 7. In this example, the high-temperature inert gas G can be blown onto the bypass pipe member 8 from a high-temperature inert gas inlet pipe member 11 to heat the inner wall of the bypass pipe member 7 therewith and also heat the bypass pipe member 8 to a sufficiently high temperature, thereby making it possible to prevent a solid product from adhering to the bypass pipe member 8.

Figure 4:
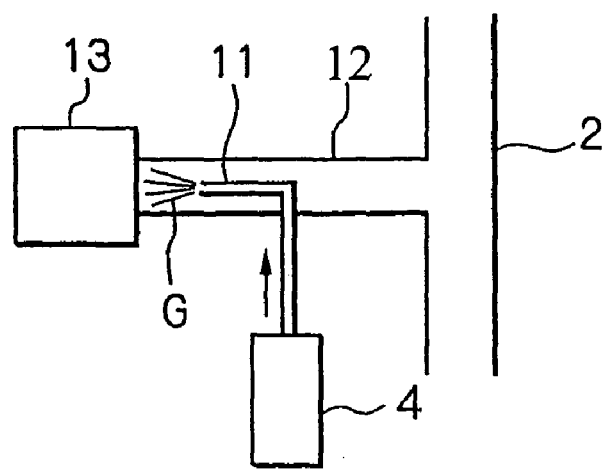
FIG. 4 is a view showing an example of a construction of an apparatus for preventing the adherence of a solid product in the gas exhaust pipe member in accordance with the present invention.

As shown in FIG. 4, the main pipe member 2 is provided with a branch pipe member 12, and a pressure gauge 13 is mounted at the tip of the branch pipe member. The pressure gauge 13 can sense a state of clogging of the main pipe member 2 with a solid product stuck in the main pipe member by measuring the pressure in the main pipe member. As shown in this drawing, the branch pipe member 12 is provided with the high-temperature inert gas inlet pipe member 11 connected to the high-temperature inert gas source 4 so as to blow a high-temperature inert gas onto the pressure gauge 13 to purge the exhaust gas entering into the branch pipe member 12 and at the same time heat the pressure gauge 13, thereby making it feasible to prevent adhesion of the solid product thereto.

Figure 5A:
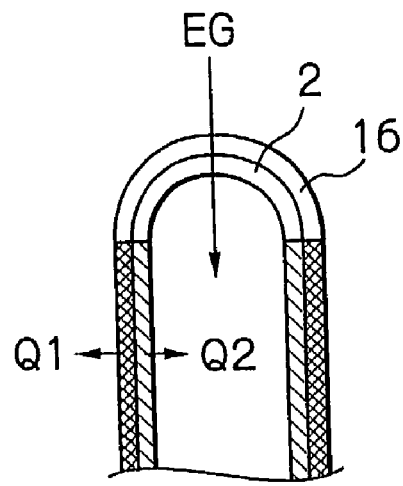
FIG. 5(a) is a conceptual view showing a conventional apparatus with a heater wound on an outer side of a gas exhaust pipe member.
Figure 5B:
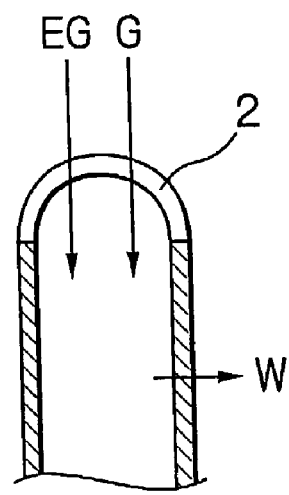
FIG. 5(b) is a conceptual view showing an apparatus for flowing an inert gas having a high temperature into a gas exhaust pipe member in accordance with the present invention.

As shown in FIG. 5(a), the conventional apparatus is constructed in such a manner that a heater 16 is wound on the outside of the main pipe member 2 made by SUS, for example, and uses the method that the main pipe member 2 is heated (by heating energy Q2) from the outside with the heater 16. Therefore, a heat-radiating energy Q1 becomes so high that a heating efficiency becomes too low. On the other hand, the apparatus according to the present invention is constructed in such a manner that the high-temperature inert gas G is flown through the inside of the main pipe member 2 made by SUS, for example, and the main pipe member is heated from the inner wall thereof (as shown in FIG. 5(b)) so that the apparatus according to the present invention has a heat-radiating energy W lower than that of the conventional one. Therefore, the apparatus according to the present invention can heat the inside of the pipe member efficiently.

Figure 6:
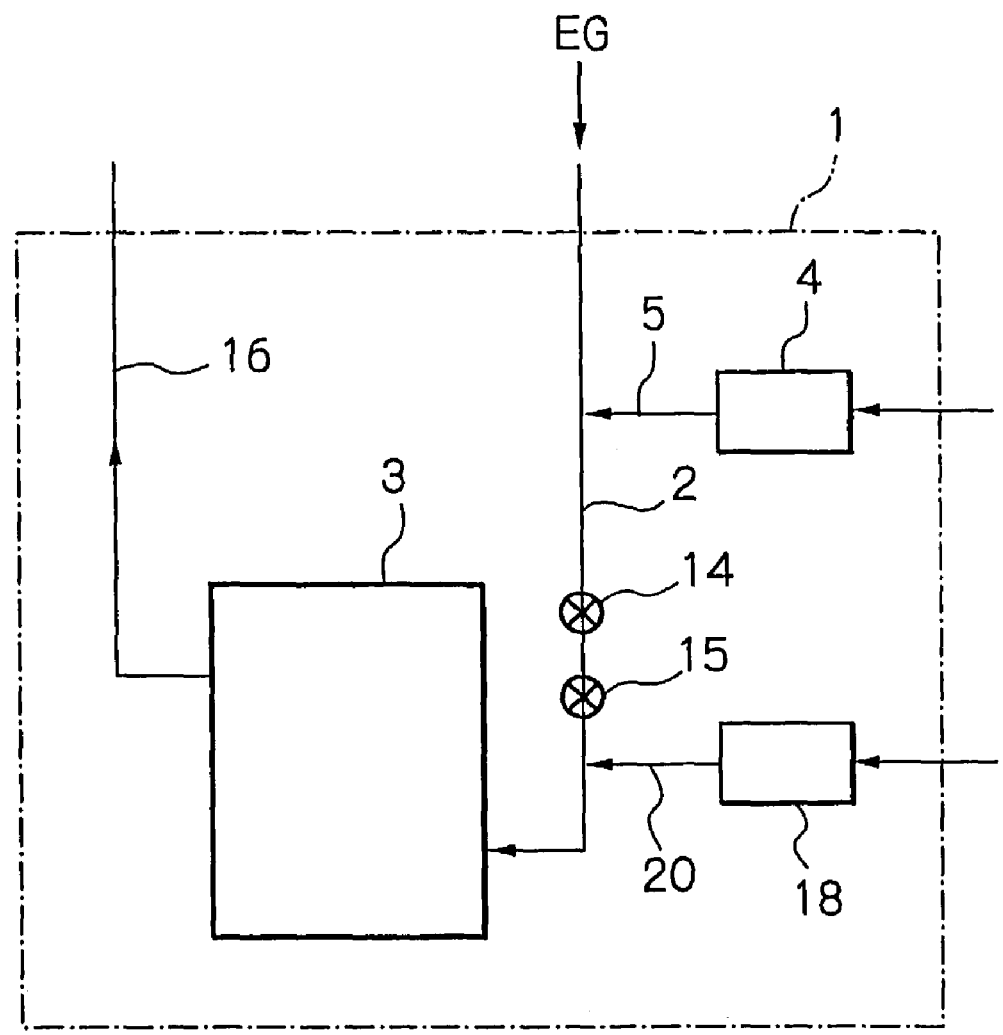
FIG. 6 is a view showing an example of a construction of a wet-type exhaust gas abatement device with the solid product removal apparatus for removing a solid product in the gas exhaust pipe member in accordance with the present invention.

FIG. 6 is a view showing an example of the construction of the wet-type exhaust gas abatement device provided with the solid product removal apparatus in accordance with the other example of the present invention. As shown in this drawing, the wet-type exhaust gas abatement device 1 has a similar structure to the system as described above, which is composed of the main pipe member 2 through which an exhaust gas flows, the reaction section 3, and an exhaust pipe member 16 (a downstream portion of the main pipe member) through which to flow the exhaust gas that was rendered non-hazardous.

The reaction section 3 may be of a liquid-dispersing type in which an exhaust gas is exposed to water in a form of mist, moisture or the like, or of a gas-dispersing type in which exhaust gas is dispersed in reserved water and passed therethrough or of a type in which these types are combined together. As is similar to the examples as described above, the high-temperature inert gas can be introduced in the main pipe member 2 through the inert gas inlet pipe member 5 from the high-temperature inert gas source 4. In addition, rinsing water can be introduced from the rinsing water source 18 through a rinsing water inlet pipe member 20.

For the wet-type exhaust gas abatement device 1 having the above-mentioned construction, a humidity within the main pipe member 2 becomes so high at the position immediately in front of the reaction section 3 that, in the case where the exhaust gas to be processed contains an ingredient that may form a solid product upon reaction with water, the solid product is likely to be formed, adhere to and deposit on the portion immediately in front of the reaction section 3 of the main pipe member. In this embodiment, however, the solid product can be effectively removed by flowing rinsing water through the portion from the rinsing water inlet pipe member 20. As the rinsing water, there may be used water or an agent. Further, adherence and deposit of the solid product can be prevented by introducing the high-temperature inert gas into the main pipe member 2 through the inert gas inlet pipe member 5 from the high-temperature inert gas source 4 in substantially the same manner as described in the examples on the basis of FIGS. 1 to 5.

For the wet-type exhaust gas abatement device as shown in FIG. 6, the inside of the main pipe member 2 is provided with a detector means 14 composed of a thermocouple or the like for detecting a state of the adherence of a solid product stuck to the inner wall face of the main pipe member 2. An amount of the rinsing water supplied from the rinsing water source 18 can be controlled on the basis of the detection results of the detector means 14. The detector means 14 may be composed of a pressure detector of a type capable of detecting pressure in the main pipe member 2 or a photosensor of a type capable of detecting a state of adherence of a solid product adhering to the inner wall face of the main pipe member 2. The detector means 14 may be mounted at any optional position as long as it can monitor the state of the adherence of the solid product in the main pipe member 2.

Further, the wet-type exhaust gas abatement device as shown in FIG. 6 is provided with a temperature sensor 15 composed of a thermocouple or the like at an optional position on the downstream side from the inert gas inlet pipe member 5 of the main pipe member 2. A flow rate of the high-temperature inert gas to be introduced into the main pipe member 2 from the high-temperature inert gas source 4 can be controlled on the basis of the output of the temperature sensor 15, thereby controlling the inner temperature of the main pipe member 2 to a given temperature that can facilitate drying of the inner wall of the main pipe member 2. It is to be noted herein, however, that a temperature sensor of this type is not always needed and that heating with the high-temperature inert gas from the high-temperature inert gas source 4 can be controlled on the basis of a state of use of the wet-type exhaust gas abatement device or a state of introduction of rinsing water. Moreover, as the heating means for drying the inner wall face of the main pipe member, there may be used, for example, a variety of means, including but being not limited to means for winding a heater about the outer face of the main pipe member.

Figure 7:
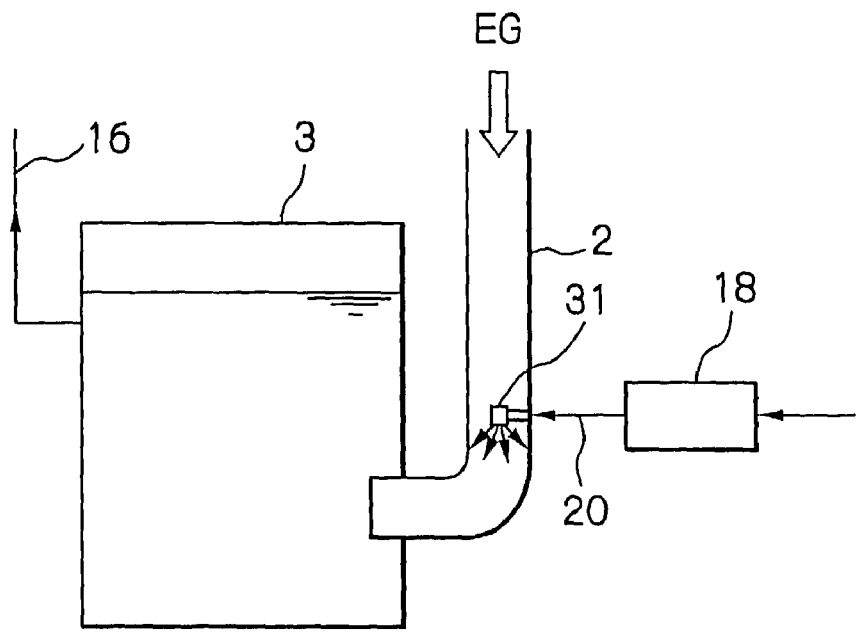
FIG. 7 is a view showing an example of a construction of a solid product removal apparatus in accordance with the present invention mounted on the wet-type exhaust gas abatement device of FIG. 6.

FIG. 7 illustrates an example of the specific construction for supplying rinsing water to the main pipe member 2 from the rinsing water inlet pipe member 20 as shown in FIG. 6. The rinsing water inlet pipe member 20 is provided with a nozzle 31 having a plurality of rinsing water spray holes at the tip thereof to spray rinsing water in a shower form towards the inner wall face of the main pipe member 2 from the rinsing water source 18. In the apparatus capable of preventing the adherence and deposit of a solid product with rinsing water, it is preferred that rinsing water to be fed into the main pipe member is allowed to flow in the same direction as the flow direction of the exhaust gas in the main pipe member leading to a reactor of the exhaust gas abatement device from the vacuum pump. In the example as shown in FIG. 7, a connecting portion of the main pipe member 2 connecting to the reactor 3 is disposed extending in a vertical direction, and the nozzle 31 is disposed so as to allow the rinsing water to feed downward in the connecting portion thereof. Therefore, the rinsing water can be flown downward as in the direction identical to the flow passage of the exhaust gas in the connecting portion thereof.

Figure 8:
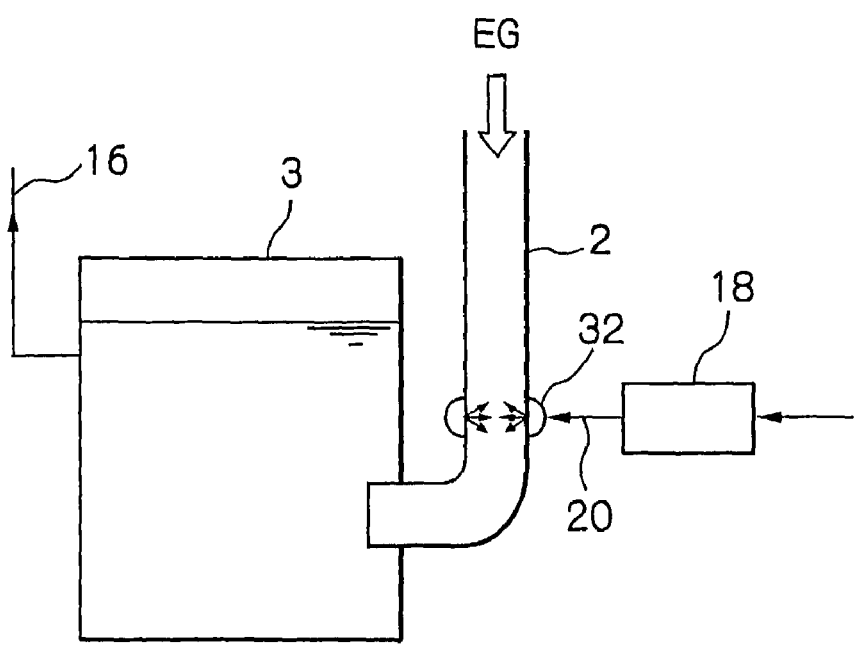
FIG. 8 is a view showing an example of a construction of a solid product removal apparatus in accordance with the present invention having the construction similar to the apparatus of FIG. 7.

FIG. 8 shows another example of the construction for the supply of rinsing water into the main pipe member. In this example, the tip of the rinsing water inlet pipe member 20 is connected to a rinsing water jacket member 32 disposed on the outer periphery of the main pipe member 2, and the rinsing water fed to the rinsing water jacket member 32 can be fed to the inner wall of the main pipe member through a number of rinsing water spraying holes (not shown) disposed through the pipe wall of the main pipe member 2.

Figure 9:
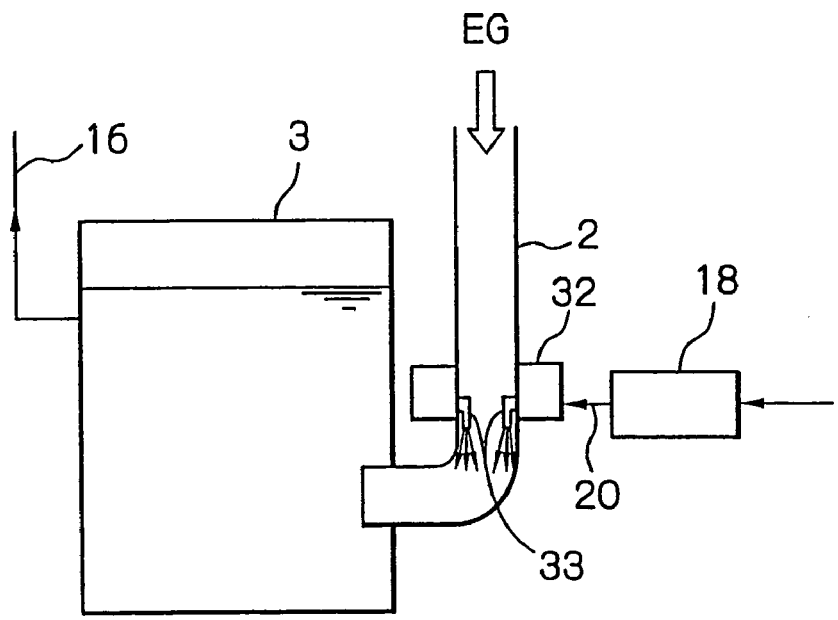
FIG. 9 is a view showing a further example of a different construction of a solid product removal apparatus in accordance with the present invention.

FIG. 9 illustrates a further example of the construction for the supply of rinsing water into the main pipe member 2. In this example, a rinsing water jacket member 32 is disposed at the outer periphery of the main pipe member 2 and a plurality of nozzles 33 communicating with the rinsing water jacket member 32 are provided in the main pipe member 2. The rinsing water is fed to the rinsing water jacket member 32 through the rinsing water inlet pipe member 20 from the rinsing water source 18, and the rinsing water is then fed to the main pipe member 2 from the nozzles 33 and allowed to flow along the inner wall face of the main pipe member.

Figure 10:
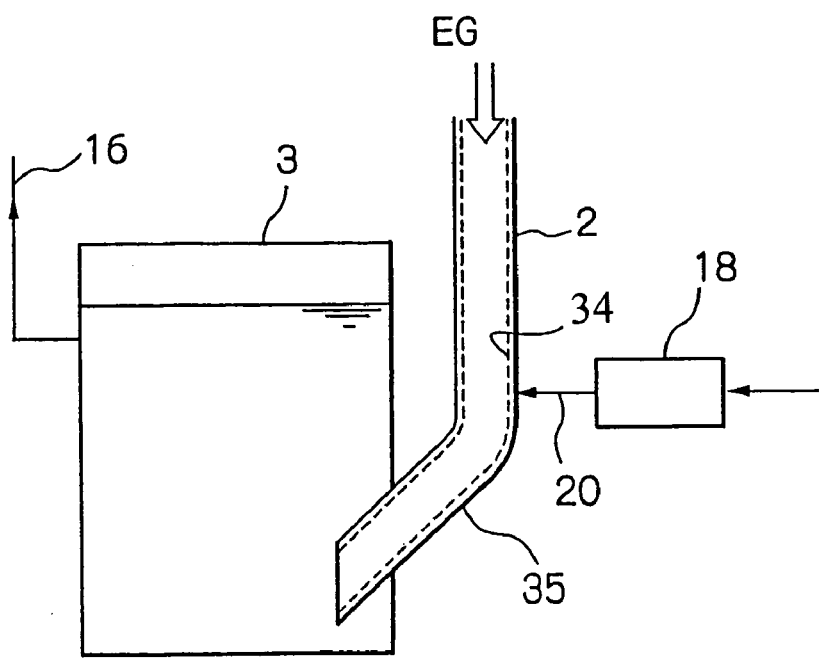
FIG. 10 is a view showing a further example of a different construction of a solid product removal apparatus in accordance with the present invention.

FIG. 10 is a view showing another example of the construction of the rinsing water inlet pipe member of the wet-type exhaust gas abatement device with the solid product removal apparatus in accordance with the present invention. In this example, the main pipe member 2 is provided with a coating 34 made of a resin material on the inner face thereof. The coating makes it difficult for a solid product to adhere to the inner wall of the main pipe member 2, and at the same time for water drops of rinsing water to remain on the inner wall of the main pipe member 2 after rinsing with the rinsing water. Further, an introduction portion 35 of the main pipe member 2 toward the reaction section 3 is connected to the reaction section 3 in a diagonal direction in order to decrease deposition of a solid product to be washed away and flown with the rinsing water on the introduction portion 35. This construction is suitable for the case, for example, where the reaction section 3 is made of a resin material or where the pipe member cannot be heated to a high temperature.

Figure 11:
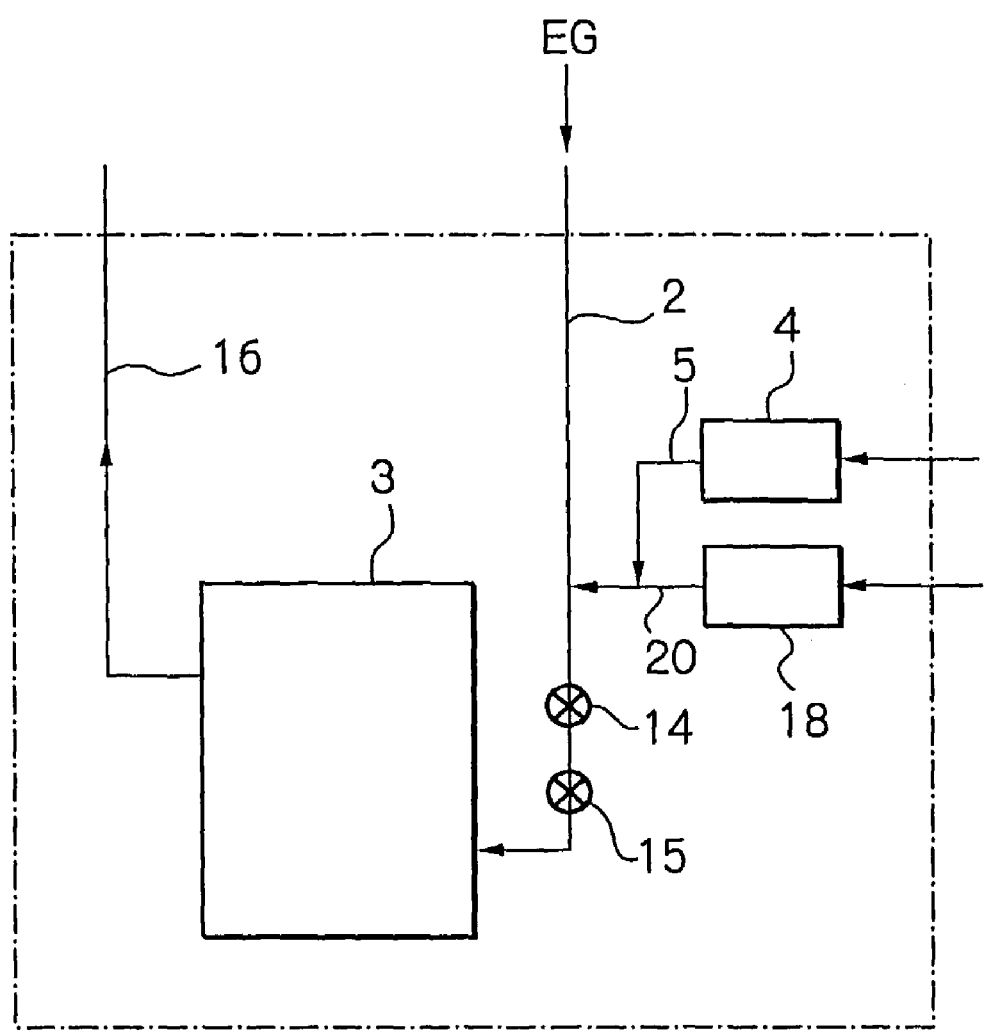
FIG. 11 is a view showing another example of a construction of a wet-type exhaust gas abatement device with the solid product removal apparatus in accordance with the present invention.

FIG. 11 is a view showing another example of the construction of the wet-type exhaust gas abatement device provided with the solid product removal apparatus in accordance with the present invention. In this example, the rinsing water inlet pipe member 20 is connected to the inert gas inlet pipe member 5 before introduction into the main pipe member 2. This construction can introduce the rinsing water into the main pipe member 2 after being heated to a high temperature with the high-temperature inert gas. Heating the rinsing water to a high temperature in the manner as described above can dissolve the solid product stuck to the inner wall of the main pipe member 2 with the rinsing water at a high temperature and remove it promptly.

Figure 12A:
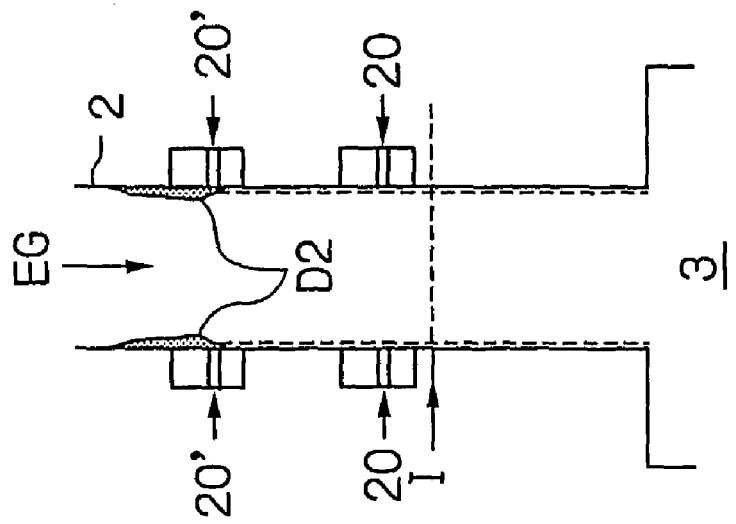
FIG. 12(a) is a view showing an example of a construction of a solid product removal apparatus for removal of a solid product in the gas exhaust pipe member in accordance with the present invention.
Figure 12B:
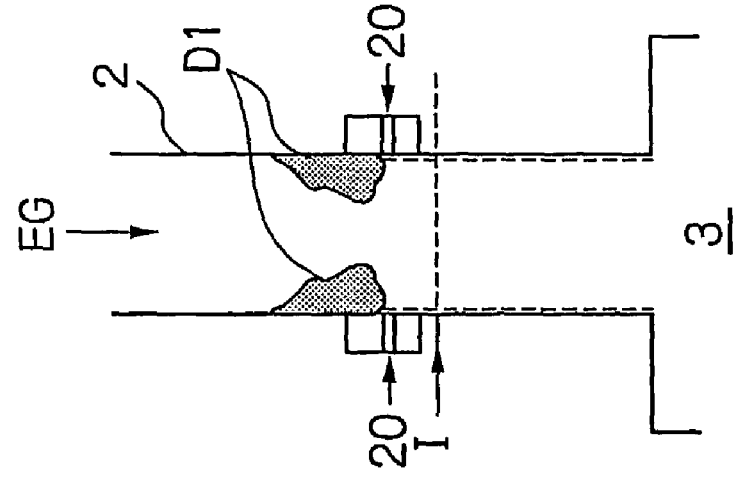
FIG. 12(b) is a view showing a solid product removal apparatus, similar to FIG. 12(a), which is provided with one rinsing water inlet pipe member.
Figure 12C:
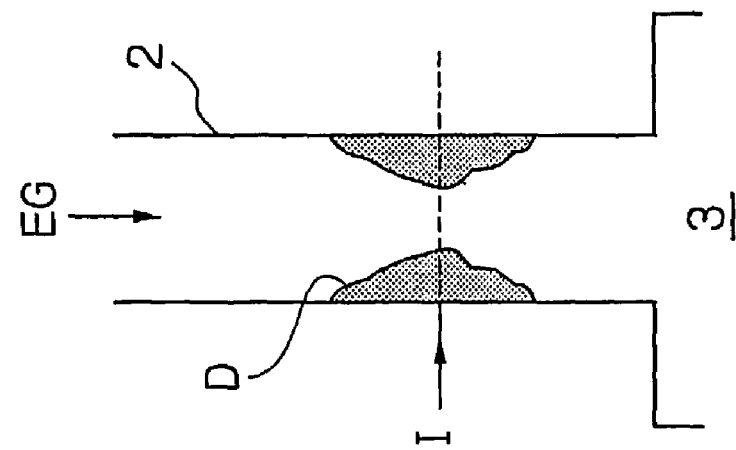
FIG. 12(c) is an illustration showing a state of the formation of a solid product without solid product removal apparatus provided.

FIG. 12(*a*) illustrates another example of means for feeding rinsing water to the main pipe member 2, as shown in FIGS. 7 and 9.

In the example as shown in FIG. 12(*a*), a first rinsing water inlet pipe member 20 and a second rinsing water inlet pipe member 20' are connected to each other at a position spaced at a given interval in the axial direction of the main pipe member 2 leading to the reactor 3 of the wet-type exhaust gas abatement device. The means for feeding the rinsing water into the main pipe member 2, as shown in FIGS. 7 to 9, is provided in order to rinse off a solid product D (as shown in FIG. 12(*c*)) stuck in a gas-liquid interface I formed in the main pipe member close to the reactor 3 in the manner as described above. Basically, as shown in FIG. 12(*b*), a rinsing water feed hole is provided at a position close to the top end of the solid product D stuck therein. In this case, the solid product D can be rinsed off, however, a fresh solid product D1 (as shown in FIG. 12(*b*)) may also be caused to adhere under supply of the rinsing water at an upstream side (at an upper position) (of the main pipe member 2) from the position at which the rinsing water is fed. The solid product D1 can be turned into a size smaller than the solid product D rinsed off with the rinsing water, but it is preferable to remove also the fresh solid product D1. The example as shown in FIG. 12(*a*) is constructed in such a manner that such a fresh solid product as the solid product D1 can also be removed.

In the rinsing work according to this example, the rinsing water is fed at a given periodical interval from the first rinsing water inlet pipe member close to the reactor 3, and the solid product D deposited on the inner face of the main pipe member close to the gas-liquid interface I can be rinsed off. On the other hand, the second rinsing water inlet pipe member 20' disposed at the upper position far apart from the reactor 3 than the first rinsing water inlet pipe member 20 can feed rinsing water at a longer periodical interval than the first rinsing water inlet pipe member 20 (that is, the rinsing water can be fed with the second rinsing water inlet pipe member 20' at every one time per a given number of times of the feeding of the rinsing water with the first rinsing water inlet pipe member 20), and the total period of time for feeding the rinsing water needed for the rinsing work by the second rinsing water inlet pipe member 20' can be rendered shorter than the total period of time for feeding the rinsing water needed for the rinsing work by the first rinsing water inlet pipe member 20.

Figure 14:
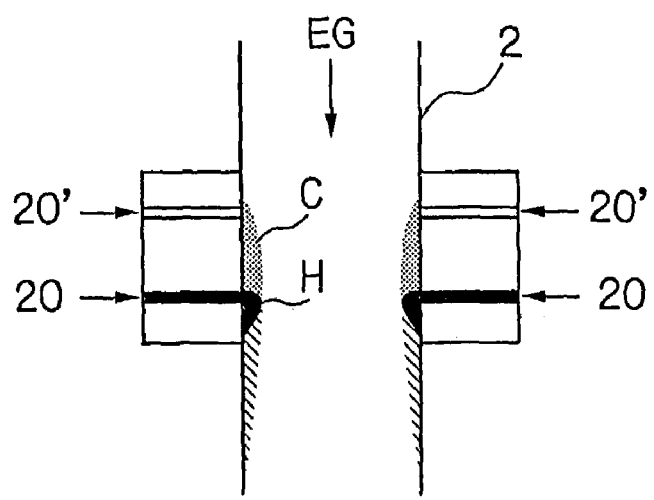
FIG. 14 is a view showing an example of rinsing work with the solid product removal apparatus of FIG. 12(a).

Even by feeding the rinsing water with the second rinsing water inlet pipe member 20' in the manner as described above, another solid product D2 may be adhering to and deposit on the inner face of the main pipe member at the upstream side from the position of feeding the rinsing water. The amount of the adhering solid product D2 is considerably smaller than the amount of the solid product D1 produced by the first rinsing water inlet pipe member 20, so that the deposit of the solid product D2 in such a smaller amount can be removed. Therefore, if rinsing water inlet pipe members having equivalent actions are provided on the main pipe member in a spaced apart relation in a vertical direction thereof, an amount of finally remaining adhered solid product, which corresponds to the solid product D2 as in the above-mentioned case where two rinsing water inlet pipe members are disposed, can be reduced in a manner of geometric series. More specifically, it is appropriate that, for instance, an amount, a frequency of introduction of rinsing water with each rinsing water inlet pipe member, and so on, are determined by an amount of a solid product deposited on the inner face of the main pipe member. At this end, an amount of the solid product deposited on the inner face of the main pipe member may be detected by methods including but being not limited to a method for determining an amount of the solid product in response to the results of detection with a sensor mounted for detecting an amount of the solid product deposited at a given position in the main pipe member or a method for determining an amount of the solid product under conditions fixed in advance in accordance with the status of operations of the reactor or the like. A solubility of some solid products in water may be temperature-dependent, and solubility in water of many of them may increase as the temperature arises. Examples of such solid products include, but are not limited to, a reaction product, $HBO_3$, resulting from a reaction between $BCl_3$ and water and a reaction product, $Si_2$, resulting from a reaction between $SiC_4$ and water. It is preferred, therefore, to elevate the temperature of the rinsing water for these solid products, but the elevation of the temperature of the rinsing water, however, may rather increase the possibility of forming a solid product in the vicinity of a portion at which the rinsing water is being fed. The cause for this may be due to an increase in a velocity of the reaction with a gaseous ingredient with the rinsing water for forming a solid product due to a rise in the temperature of the rinsing water. Therefore, in order to decrease the formation of such solid products, it is preferred that the temperature of the rinsing water in the vicinity of the top edge of the rinsing water on the inner face of the main pipe member be decreased to the lowest possible level, while the rinsing water as a whole is kept at a high temperature. With these points taken into account, in the example as shown in FIG. 14, the rinsing water can be fed in a temperature distribution as described above by feeding rinsing water H having a higher temperature from the first rinsing water inlet pipe member 20 and rinsing water C having a lower temperature from the second rinsing water inlet pipe member 20'.

The rinsing water inlet pipe member is mounted on the main pipe member in the vicinity of an inlet of the reactor 3 for the wet-type exhaust gas abatement device in the manner as shown in FIG. 12(*a*), and a gas containing $BCl_3$ was subjected to processing experiments (Experiments #1, #2 and #3) for rinsing a solid product adhering to the inner face of the main pipe member under conditions as will be described below.

(Conditions of Gas)
Flow Rate of Gas: 10 slm
Concentration of $BCl_3$: 10%

(Conditions of Feeding Rinsing Water)
Feeding Interval:
    Experiment #1: No rinsing water fed.
    Experiment #2: Feeding for 10 seconds and ceased feeding for 5 minutes and 50 seconds (1 cycle=6 minutes)
    Experiment #3: Feeding for 10 seconds and ceased feeding for 5 minutes and 50 seconds (1 cycle=6 minutes)
Feeding Modes:
    Experiment #2: the rinsing water inlet pipe member 20 only was used.
    Experiment #3: In one cycle, feeding 9 times from the rinsing water inlet pipe member 20 and then feeding once from the rinsing water inlet pipe member 20'.

Amount of Feeding:
 Experiment #2: 2.4 liters per minute
 Experiment #3: 2.4 liters per minute (total amount)
Period of Experiment: 120 minutes After the completion of the experiments, powdery materials stayed at the portion leading from the main pipe member to the reactor was dissolved, and the concentration of boron (B) in water was measured to determine an amount of an adhering solid product as $H_3BO_3$. The following table indicates the results of the above experiments.

|  | Inner Face of Main Pipe Member | Gas Inlet Portion of Reactor |
| --- | --- | --- |
| Experiment #1 | 0.01 gram | 5.1 gram Almost clogged |
| Experiment #2 | 0.93 gram The solid product was adhering in a large amount between two rinsing water inlet pipe members. An almost half of the pipe member was clogged. | 0.02 gram |
| Experiment #3 | 0.03 gram The solid product was adhering in a small amount on the upper portion of the rinsing water inlet pipe member. The state of the pipe member was substantially the same as before the experiment. | 0.01 gram |

In the above examples, two rinsing water inlet pipe members 20 and 20' are provided designing so as to cause the rinsing water inlet pipe member on the upstream side of the main pipe member to remove the solid product derived by the introduction of the rinsing water from the rinsing water inlet pipe member at the downstream side thereof. It is found therefrom, however, that the relationship of the positions of the rinsing water inlet pipe members is not limited to this embodiment and that, in summary, in order to allow the solid product formed by the rinsing water fed previously, adhering and deposited to be removed, the rinsing water to be fed later is fed such that the top end thereof on the inner face of the main pipe member reaches above the top end of the solid product formed beforehand.

For instance, when description is made taking the example as shown in FIG. 12, the second rinsing water inlet pipe member 20' may be mounted at a position lower than the first rinsing water inlet pipe member. Moreover, if it is possible to feed the rinsing water in a manner so as to satisfy the conditions described above, it is not needed to provide the rinsing water inlet pipe members in a vertically spaced apart relationship in plural stages along the main pipe member. In other words, the rinsing water inlet pipe member can be disposed in a single stage (that is to say, a rinsing water inlet pipe member is disposed at a single position of the main pipe member), and the rinsing action can be done in substantially the same manner as described in the above examples by changing the pressure of feeding the rinsing water.

Figure 13:
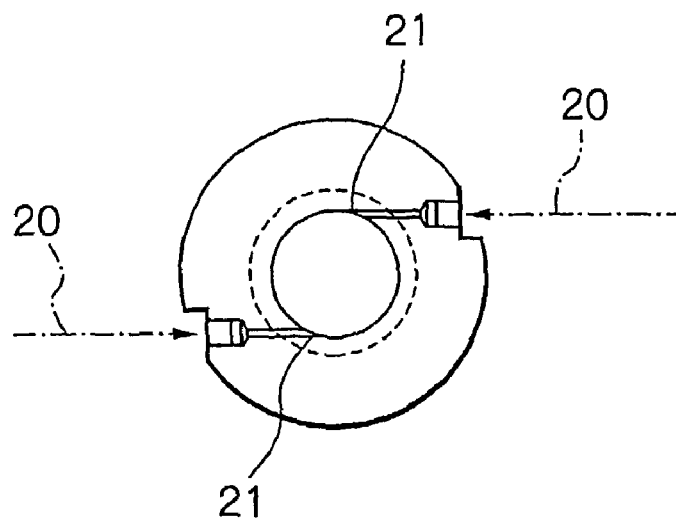
FIG. 13 is a view showing an example of the disposition of a tip opening of a rinsing water inlet pipe member in the solid product removal apparatus in accordance with the present invention.

When the rinsing water is fed into the main pipe member through the rinsing water inlet pipe member, it is preferred that the location of the inner face of the main pipe member where it becomes wet with the fed rinsing water due to scattering of the rinsing water upon striking onto the inner face of the main pipe member does not expand upwardly above a given location. It is preferred, therefore, that the tip opening 21 of the rinsing water inlet pipe member 20 be disposed in a direction tangent to the inner face of the main pipe member 20, as shown in FIG. 13. Moreover, it is preferred that the tip opening 21 be disposed so as to be directed horizontally or downwardly, not upwardly, from the point of view of preventing the rinsing water from scattering or controlling the maximal height of the fed rinsing water on the inner face of the main pipe member (controlling the position of the top edge thereof). The rinsing water discharged from the tip opening 21 into the inner face of the main pipe member flows downward on the inner face of the main pipe member while circulating around the central axial line of the inner face thereof under a centrifugal force. The maximal height at which the rinsing water can reach on the inner face of the main pipe member can be determined by the flow speed of the rinsing water flowing downward. Therefore, in the case where the rinsing water inlet pipe member is disposed in a single stage in the manner as described above, substantially the same effects can be achieved by controlling the flow speed of the rinsing water as the rinsing action is carried out by mounting the rinsing water inlet pipe members in plural stages in the manner as described above.

Figure 15:
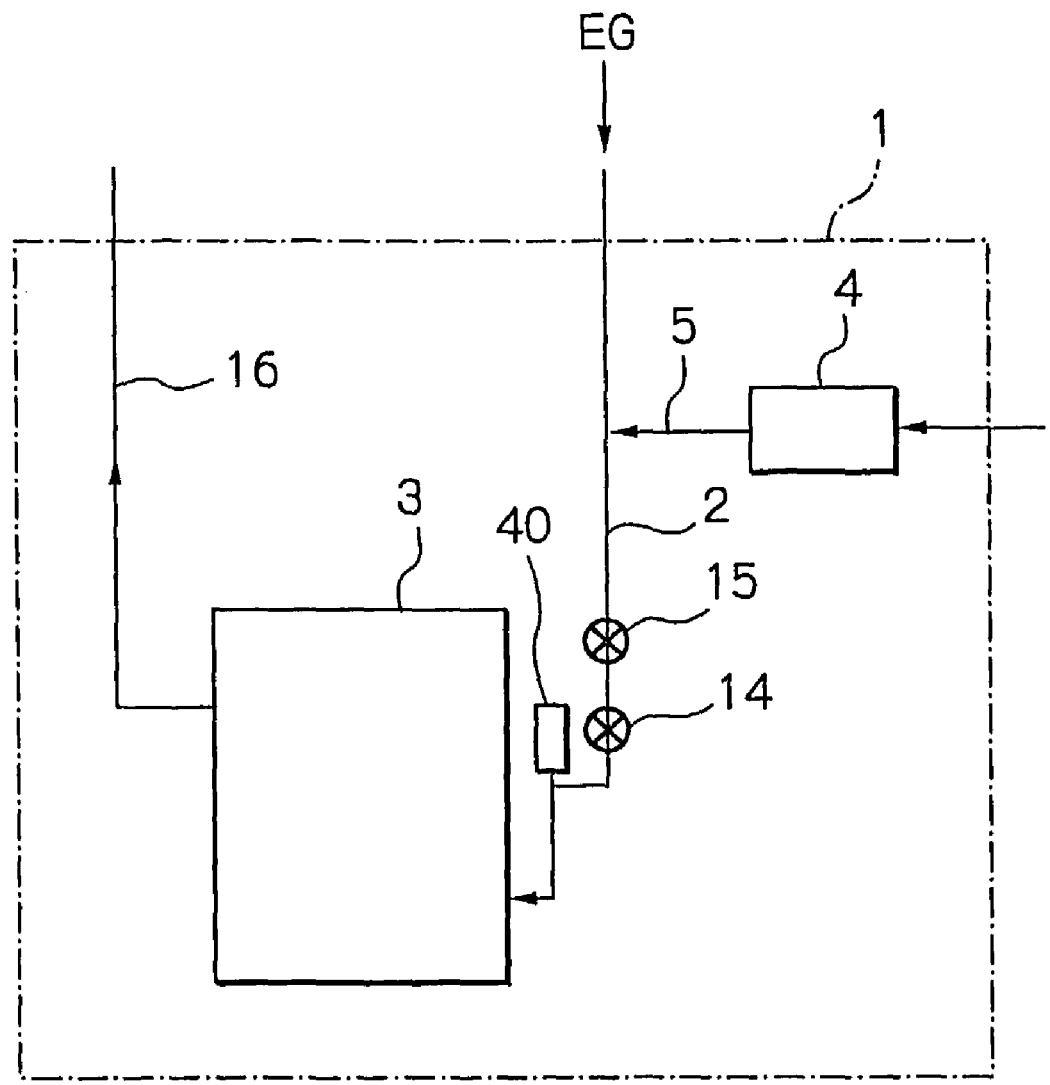
FIG. 15 is a view showing a further example of a construction of a wet-type exhaust gas abatement device provided with a solid product removal apparatus for removal of the solid product in the gas exhaust pipe member in accordance with the present invention.

FIG. 15 is a view showing an example of the construction of the wet-type exhaust gas abatement device with the solid product removal apparatus according to another example of the present invention. As shown in FIG. 15, the wet-type exhaust gas abatement device 1 has substantially the same structure as those described above, which is composed of the main pipe member 2 through which to flow exhaust gas, the reaction section 3, and the gas discharging pipe member 16 through which to flow a non-hazardous exhaust gas. The main pipe member 2 is designed in substantially the same manner as described above to introduce a high-temperature inert gas from the high-temperature inert gas source 4 through the inert gas inlet pipe member 5 to control the formation of a solid product in the main pipe member. In this example, in addition thereto, a solid product removal means 40 for scraping the solid product stuck to a portion of the main pipe member 2 at the reactor 3 is provided at the portion of the main pipe member 2 in substantially the same manner as described above.

Figure 16:
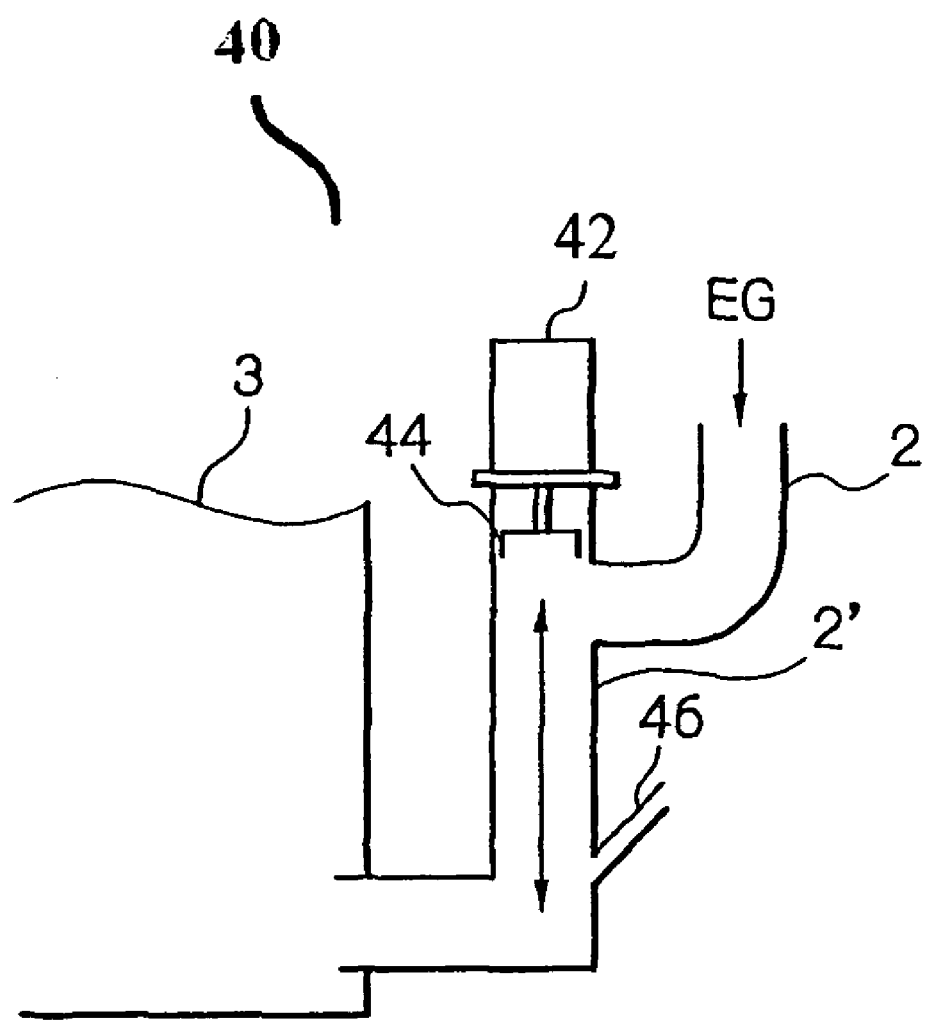
FIG. 16 is an illustration showing an example of a construction of the solid product removal apparatus of FIG. 15.
Figure 17:
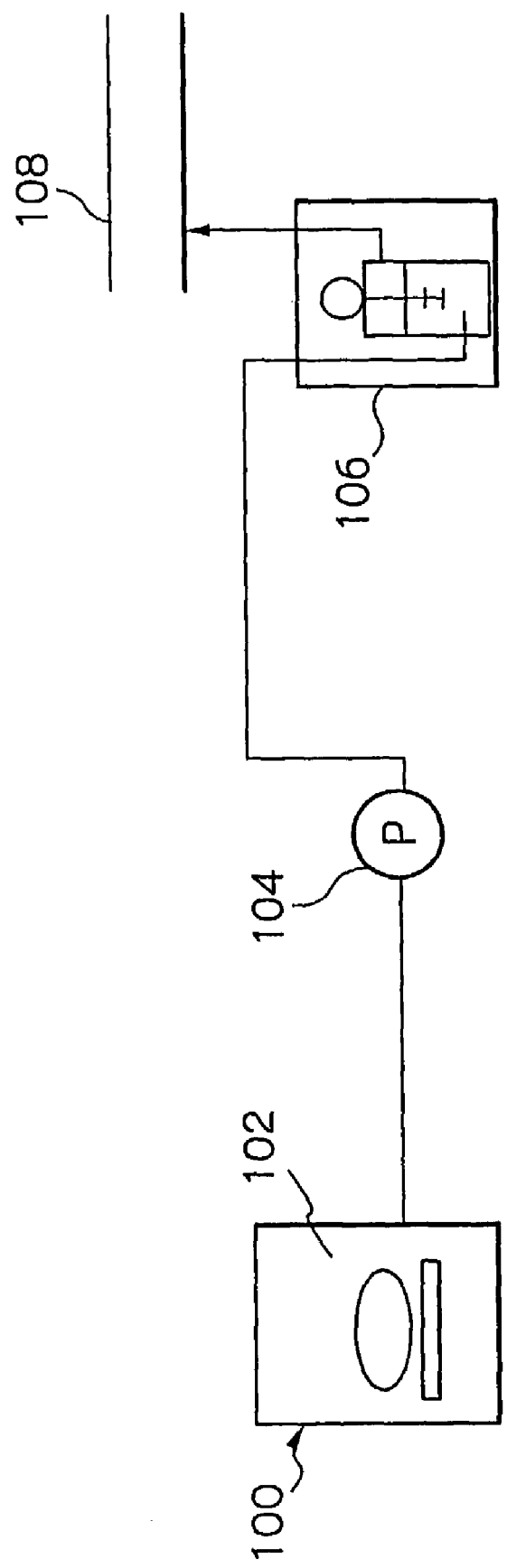
FIG. 17 is a view showing an exhaust gas processing system for a semiconductor manufacturing apparatus.

A specific construction of the solid product removal means 40 is illustrated in FIG. 16. As shown in this drawing, the solid product removal means 40 may be composed of a drive means 42 such as a motor or the like, disposed at the top end of a pipe member portion 2' extending vertically from the reactor 3 of the main pipe member 2 and a scraping member means 44 disposed so as to be movable vertically in the pipe member portion 2' by the drive means for scraping the solid product stuck on the inner face of the pipe member portion. The scraping member means may be of any type that can scrape the solid product by sliding on the inner face of the pipe member portion 2', and it may include but is not limited to a type in the form of a disc, spiral, bar or the like or a type capable of rotating in addition to moving vertically.

In this drawing, reference numeral 46 stands for a rinsing water inlet pipe member so disposed as to rinse off the solid product adhering to the scraping member means 44 and the inner face of the pipe member portion 2' by appropriately feeding rinsing water into the pipe member portion 2'. In FIG. 15, reference numeral 14 stands for a detector means for detecting a state of the adherence of the solid product adhering to the inner wall face of the pipe member portion 2' by detecting the pressure within the main pipe member. Reference numeral 15 stands for a temperature sensor for controlling the high-temperature inert gas source 4.

INDUSTRIAL APPLICABILITY

Although the present invention is particularly suitable for a gas exhaust system of a semiconductor manufacturing apparatus, it is to be understood that it is not limited to the gas exhaust system thereof and it can be applied to a variety of gas exhaust systems.

The invention claimed is:

1. A solid product removal method for removing a solid product adhering to an inner face of a gas exhaust pipe member, characterized in that the method comprises the steps of:

rinsing off a primary solid product formed upon reaction of an ingredient contained in exhaust gas with a moisture present in the gas exhaust pipe member and adhering to the inner face of the gas exhaust pipe member by feeding a primary rinsing water to the primary solid product; and rinsing off a secondary solid product formed newly upon reaction with the primary rinsing water and adhering to the inner face of the gas exhaust pipe member at an upstream side from the position at which the primary rinsing water is fed by feeding a secondary rinsing water to the secondary solid product in the gas exhaust pipe member, wherein the gas exhaust pipe member is provided with a first rinsing water supply inlet and a second rinsing water supply inlet;

wherein said first and second water supply inlets are spaced apart at a given interval along a direction of flow of exhaust gas;

the primary rinsing water is fed from the first rinsing water supply inlet;

the secondary rinsing water is fed from the second rinsing water supply inlet, the second rinsing water supply inlet is disposed at the upper position than the first rinsing water supply inlet, and the secondary rinsing water is fed at a longer periodical interval than the primary rinsing water.

2. The solid product removal method according to claim 1, wherein the secondary rinsing water has a lower temperature than that of the primary rinsing water.

\* \* \* \* \*